US007214295B2

(12) United States Patent
Vincent

(10) Patent No.: US 7,214,295 B2
(45) Date of Patent: May 8, 2007

(54) METHOD FOR TANTALUM PENTOXIDE MOISTURE BARRIER IN FILM RESISTORS

(75) Inventor: Stephen C. Vincent, Norfolk, NE (US)

(73) Assignee: Vishay Dale Electronics, Inc., Columbus, NE (US)

( * ) Notice: Subject to any disclaimer, the term of this patent is extended or adjusted under 35 U.S.C. 154(b) by 758 days.

(21) Appl. No.: 09/829,169

(22) Filed: Apr. 9, 2001

(65) Prior Publication Data

US 2002/0145503 A1 Oct. 10, 2002

(51) Int. Cl.
*C23C 14/35* (2006.01)
*C23C 16/00* (2006.01)

(52) U.S. Cl. ........................... 204/192.21; 204/192.22; 427/101; 427/103

(58) Field of Classification Search ........... 204/192.21, 204/192.22; 427/101, 103
See application file for complete search history.

(56) References Cited

U.S. PATENT DOCUMENTS 3,878,079 A 4/1975 Schauer
4,002,542 A * 1/1977 Young ................... 204/192.21
4,019,168 A 4/1977 Collins
4,161,431 A 7/1979 Matsunaga et al.
4,217,570 A 8/1980 Holmes
4,288,776 A 9/1981 Holmes
4,539,434 A 9/1985 Krause
4,617,575 A * 10/1986 Fuyama et al. ......... 346/76 PH
4,705,697 A 11/1987 Nishiguchi et al.
4,708,915 A 11/1987 Ogawa et al.
4,725,859 A 2/1988 Shibata et al.
4,734,709 A 3/1988 Kobayashi et al.
4,777,583 A * 10/1988 Minami et al. ......... 346/76 PH
4,837,550 A 6/1989 Plough, Jr.
4,952,904 A 8/1990 Johnson et al.
4,965,594 A 10/1990 Komuro
5,076,906 A * 12/1991 DerMarderosian, Jr. . 204/153.1
5,798,684 A 8/1998 Endo et al.

(Continued)

FOREIGN PATENT DOCUMENTS

GB 1022075-X 3/1966

(Continued)

OTHER PUBLICATIONS

S. Seki, T. Unagami, and B. Tsujiyama, Electrical Characteristics of the RF Magnetron-Sputtered Tantalum Pentoxide-Silicon Interface, J. Elcetrochem. Soc.: Solid-State Science and Technology, vol. 131, No. 11, Nov. 1984.

(Continued)

*Primary Examiner*—Rodney G. McDonald
(74) *Attorney, Agent, or Firm*—McKee, Voorhees & Sease, P.L.C.

(57) ABSTRACT

The present invention discloses a method of manufacturing a thin film resistor with a moisture barrier by depositing a metal film layer on a substrate and depositing a layer of tantalum pentoxide film overlaying the metal film layer. The present invention also includes a thin film resistor having a substrate; a metal film layer attached to the substrate; and a tantalum pentoxide layer overlaying the metal film layer, the tantalum pentoxide layer providing a barrier to moisture, the tantalum pentoxide layer not overlaid by an oxidation process.

7 Claims, 1 Drawing Sheet

U.S. PATENT DOCUMENTS

| | | | | | |
|---|---|---|---|---|---|
| 5,940,110 | A * | 8/1999 | Nakamura et al. | .......... | 347/208 |
| 6,353,381 | B1 | 3/2002 | Dietmann et al. | | |
| 2001/0017770 | A1 * | 8/2001 | Copetti et al. | .............. | 361/765 |
| 2002/0084885 | A1 | 7/2002 | Weinand et al. | | |

FOREIGN PATENT DOCUMENTS

| | | | | |
|---|---|---|---|---|
| JP | 52-3196 | * | 1/1977 | |
| JP | 52003196 | A | 1/1977 | |
| JP | 55050221 | A | 4/1980 | |
| JP | 59-26277 | * | 2/1984 | |
| JP | 61-27264 | * | 2/1986 | ................. 219/216 |
| JP | 01133755-X | | 5/1989 | |
| JP | 01291401-X | | 11/1989 | |
| JP | 07153603-X | | 6/1995 | |

OTHER PUBLICATIONS

H. Hoo, W.Xiong, P. McDonald, R. Raman, P. Gilman, Proceedings of Sony Research Forum, 1998.

J. Licari, L. Enlow, Hybrid Microcircuit Technology Handbook, p. 62, 1988.

* cited by examiner

METHOD FOR TANTALUM PENTOXIDE MOISTURE BARRIER IN FILM RESISTORS

BACKGROUND OF THE INVENTION

This invention relates to a method and apparatus for a thin film resistor having a tantalum pentoxide moisture barrier.

Current film resistors and the associated processes of making such resistors have had problems with the ability to create or use an effective moisture barrier. A moisture barrier is that layer that is deposited on the surface of the resistor in order to prevent moisture in the form of condensation or vapor from degrading the resistive film element. Screen-printed material has been used as a moisture barrier and this has been shown to reduce the failure rate of the resistor due to moisture. However, problems remain.

Tantalum pentoxide has been used in the semiconductor industry as an insulator and to improve recording performance of cobalt alloy media on glass-ceramic disks. Tantalum pentoxide has been used within the resistor industry to improve resistive elements integrated with spark plugs and to form a graze resistor. It is also associated with a tantalum nitride resistive system that prevents moisture failure. It is recognized that tantalum nitride resistors have a naturally occurring layer of tantalum pentoxide, the result of an oxidation process. Further, tantalum nitride resistors and tantalum nitride capacitors are known for their resistance to moisture.

Many thin film resistors, especially those of nickel-chromium alloys and other alloys containing nickel, chromium, and other metals are particularly susceptible to moisture conditions. These and other types of alloys have a failure mode of electrolytic corrosion that is capable of causing an electrical open under certain moisture conditions. In particular, under powered moisture conditions, electrolytic corrosion can occur and the resistor can fail. This makes the thin film resistor unsuitable for applications where moisture conditions may occur.

Thus, it is a primary object of the present invention to provide an improved method and apparatus for a moisture barrier for film resistors.

Another object of the present invention is to provide a method and apparatus for a film resistor which is less susceptible to powered moisture testing.

Another object of the present invention is to provide a method and apparatus for a moisture barrier capable of use with nickel-chromium, alloy thin film resistors.

Yet another object of the present invention is to provide a method and apparatus for a moisture barrier for thin film resistors that does not require tantalum nitride.

Another object of the present invention is to provide a method and apparatus for a moisture barrier for a thin film resistor replaces screen-printed moisture barriers.

Yet another object of the present invention is to provide a method and apparatus for a moisture barrier for a thin film resistor that is compatible with normal manufacturing techniques and materials.

A further object of the present invention is to provide a method and apparatus for a moisture barrier for a thin film resistor that can be used with nickel and chromium alloys.

Yet another object of the present invention is to provide a method and apparatus for a moisture barrier for a thin film resistor that performs favorably under MIL-STD-202 method 103 testing.

A further object of the present invention is to provide a method and apparatus for a moisture barrier for a thin film resistor that performs favorably under MIL-STD-202 method 106 testing.

Yet another object of the present invention is to a method and apparatus to reduce or eliminate failures of thin film resistors due to electrolytic corrosion under powered moisture conditions.

Another object of the present invention is to provide a method and apparatus for a moisture barrier that may be deposited through sputtering.

These and other objects, features, or advantages of the present invention will become apparent from the specification and claims.

BRIEF SUMMARY OF THE INVENTION

The present invention is a method and apparatus for a tantalum pentoxide moisture barrier in thin film resistors. The invention provides for a tantalum pentoxide moisture barrier to be used in manufacturing a thin film resistor using otherwise standard manufacturing processes. The invention permits any number of metal films to be used as the resistive element. In particular, the invention permits nickel-chromium alloys to be used. The resistive metal film layer is overlaid with a moisture barrier of tantalum pentoxide. The tantalum pentoxide layer acts as a moisture barrier.

The tantalum pentoxide layer results in a thin film resistor that is resistive to moisture. In particular, the tantalum pentoxide moisture barrier allows the thin film resistor to be more resistant to electrolytic corrosion that causes an electrical open under certain moisture conditions. Thus the present invention provides for increased reliability in thin film resistors while using substantially conventional manufacturing techniques.

DETAILED DESCRIPTION OF THE INVENTION

Figure 1:
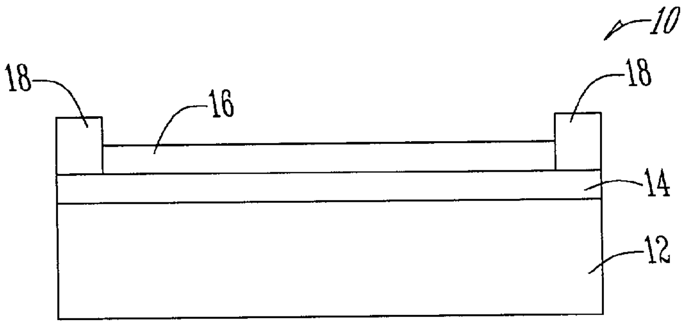
Fig.1 (PRIOR ART)
FIG. 1 is a side view of a prior art thin film resistor.

FIG. 1 shows a prior art thin film resistor that may be manufactured with standard manufacturing processes. In FIG. 1, a substrate 12 is used. The substrate 12 may be alumina or other substrate that may be used in thin film processes. Overlaid on the substrate is a layer of a metal film which serves as the resistive element for the thin film resistor. The metal film layer 14 may be any number of metal films but is often a nickel-chromium (nichrome) alloy or other alloy containing nickel and/or chromium. Nickel-chromium is one of the most common types of metal films used in thin film resistors. Overlaying the metal film layer 14 is passivation layer 16. The passivation layer 16 may be used to protect the thin film resistors electronic properties from deterioration from external contaminants. The passivation layer 16 may be a deposited scratch resistant material such as silicon nitride, silicon dioxide, or other materials such as may be known in the art. The thin film resistor 10 also includes termination 18. The termination 18 on the ends of the thin film resistor is used to electrically connect the thin film resistor.

Figure 2:
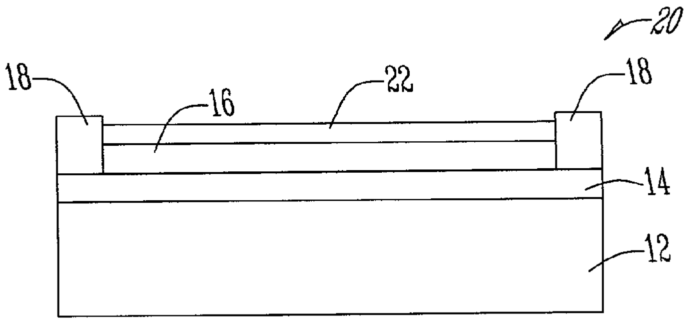
FIG. 2 is a side view of the thin film resistor having a tantalum pentoxide moisture barrier of the present invention.

The thin film resistor of the present invention is shown in FIG. 2. The thin film resistor 20 is manufactured in a manner similar to the thin film resistor 10 of FIG. 1. However, the thin film resistor 20 of FIG. 2 also includes a moisture barrier layer 22. The moisture barrier layer 22 is a layer of tantalum pentoxide film. The tantalum pentoxide film may be sputtered onto the thin film resistor, the tantalum pentoxide layer overlaying the resistive metal film layer and optionally a passivation layer. The present invention contemplates that the passivation layer need not be used.

The addition of the tantalum pentoxide layer reduces failure due to electrolytic corrosion that causes an electrical open under certain moisture conditions. The thin film resistor 20 may use alumina as substrate 12, or other substrate material. The present invention is no way limited to the particular selection of the substrate, however, the present invention is capable of use in standard manufacturing processes. The passivation layer may be a layer of silicon nitride, silicon dioxide, or other material such as may be known in the art. The present invention contemplates that any number of metal films could be used, including metal films containing nickel, chromium, or both. Termination 18 for the thin film resistor 20 may be any type of termination typically used with thin film resistors. For example, termination 18 may include wrap around termination.

The thin film resistor of the present invention using a nickel-chromium metal film layer and having a tantalum pentoxide moisture barrier has been evaluated according to standard environmental test methods. The thin film resistor using a 1206-size wrap around termination chip resistor subjected to MIL-STD-202 method 103 tests. These tests are designed to evaluate the properties of materials used in electronic components as they are influenced by the absorption and defusion of moisture and moisture vapor. The test is an accelerated environmental test that uses high relative humidity and an elevated temperature. According to the test, a temperature of 40° C. and a relative humidity of between 90% and 95% was used. 10 Volts DC was applied to the resistors for 96 hours.

In the 96-hour test, the typical failure rate (without tantalum pentoxide) is from 0 to 4 parts per lot test open. Testing of the tantalum pentoxide moisture barrier thin film resistors where tantalum pentoxide was used as a moisture barrier indicates that there were no opens.

A second test was conducted with a second group of thin film resistors having the tantalum pentoxide moisture barrier. For the second test, the MIL-STD-202 method 106 was used for testing moisture resistance. This test differs from the previous test as it uses temperature cycling to provide alternate periods of condensation and drying. According to this test, the temperature range selected was between 65° C. to −10° C. with a relative humidity of between 90% and 100%. The test was conducted over a 240 hour period with 10 Volts DC applied.

In typical results for the 240 hour test (no tantalum pentoxide moisture barrier), approximately 90 percent of the resistors test fail. Test results for the 240 hour test where tantalum pentoxide is used as a moisture barrier reveal that there were no failures.

Figure 3:
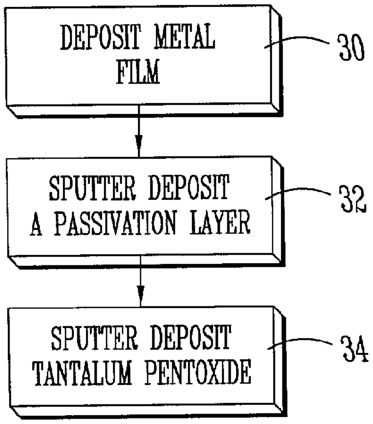
FIG. 3 is a flow chart showing a method of the present invention.

The method of the thin film resistor of the present invention is best shown in FIG. 3. The thin film resistor of the present invention can be manufactured in a manner substantially consistent with thin film manufacturing processes. In step 30 a metal film is deposited through sputtering or other techniques. The metal film may be of an alloy containing copper, chromium, nichrome, or other metal such as may be known in the art. optionally, in step 32, a passivation layer is deposited. The passivation layer may deposit through sputtering or through other techniques. The passivation layer is used to protect the thin film resistor from external contaminants. In step 34, a layer of tantalum pentoxide is deposited. The tantalum pentoxide layer may be deposited through sputtering or other techniques. The tantalum pentoxide layer serves as a moisture barrier to reduce electrolytic corrosion of the thin film resistor.

Thus, an apparatus and method for a thin film resistor having a tantalum pentoxide moisture barrier has been disclosed which solves problems and deficiencies in the art.

What is claimed is:

1. A method of manufacturing thin film resistors comprising: forming a plurality of discrete component thin film chip resistors, each of the plurality formed by:

(a) depositing a non-tantalum metal film resistive layer on a thin film resistor substrate;

(b) attaching a thin film resistor termination on each end of the metal film resistive layer; and (c) depositing an outer moisture barrier consisting of tantalum pentoxide directly overlaying and contacting the metal film resistive layer to form one of the plurality of thin film chip resistors wherein the moisture barrier is formed from deposition of the tantalum pentoxide and not through oxidation of tantalum and wherein the outer moisture barrier reduces failures due to electrolytic corrosion under powered moisture conditions;

exposing selected thin film chip resistors to powered moisture conditions;

observing failures due to electrolytic corrosion under powered moisture conditions in the selected thin film chip resistors.

2. The method of claim 1 wherein the step of depositing a layer of tantalum pentoxide is sputtering tantalum pentoxide film.

3. The method of claim 1 wherein the metal film layer is an alloy containing nickel.

4. The method of claim 1 wherein the metal film layer is an alloy containing chromium.

5. The method of claim 1 wherein the metal film layer is a nickel-chromium alloy.

6. A method of manufacturing thin film chip resistors comprising:

forming a plurality of discrete component thin film chip resistors, each of the plurality formed by:

(a) depositing a non-tantalum metal film resistive layer on a substrate;

(b) attaching a termination on each end of the metal film resistive layer;

(c) depositing a passivation layer directly overlaying and contacting the metal film layer; and (d) depositing an outer moisture barrier consisting of tantalum pentoxide directly overlaying and contacting the passivation layer to form one of the plurality of thin film chip resistors, wherein the moisture barrier is formed from deposition of the tantalum pentoxide and not through oxidation of tantalum;

exposing selected thin film chip resistors from the plurality of thin film chip resistors to powered moisture conditions;

observing failure due to electrolytic corrosion under powered moisture conditions in the selected thin film chip resistors.

7. A method of manufacturing a discrete component thin film chip resistor, comprising:

depositing a non-tantalum metal film resistive element on a thin film resistor substrate; attaching a thin film resistor termination on each end of the non-tantalum metal film resistive element;

depositing an outer moisture barrier consisting of tantalum pentoxide directly overlaying and contacting the non-tantalum metal film resistive element;

wherein the moisture barrier is formed from deposition of the tantalum pentoxide and not through oxidation of tantalum;

wherein the outer moisture barrier reduces failures due to electrolytic corrosion under powered moisture conditions.

* * * * *